United States Patent
Qin et al.

(10) Patent No.: US 9,136,282 B2
(45) Date of Patent: Sep. 15, 2015

(54) MEMORIES AND METHODS OF FORMING THIN-FILM TRANSISTORS USING HYDROGEN PLASMA DOPING

(71) Applicant: Micron Technology, Inc., Boise, ID (US)

(72) Inventors: Shu Qin, Boise, ID (US); Haitao Liu, Boise, ID (US); Zhenyu Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/599,886

(22) Filed: Jan. 19, 2015

(65) Prior Publication Data

US 2015/0206906 A1    Jul. 23, 2015

Related U.S. Application Data

(63) Continuation of application No. 13/739,679, filed on Jan. 11, 2013, now Pat. No. 8,940,592.

(51) Int. Cl.
| | |
|---|---|
| *H01L 21/00* | (2006.01) |
| *H01L 21/84* | (2006.01) |
| *H01L 27/12* | (2006.01) |
| *H01L 27/115* | (2006.01) |
| *H01L 29/04* | (2006.01) |
| *H01L 29/16* | (2006.01) |
| *H01L 21/02* | (2006.01) |
| *H01L 21/223* | (2006.01) |
| *H01L 21/324* | (2006.01) |
| *H01L 21/285* | (2006.01) |

(52) U.S. Cl.
CPC ........ *H01L 27/1222* (2013.01); *H01L 21/0257* (2013.01); *H01L 21/02532* (2013.01); *H01L 21/02595* (2013.01); *H01L 21/2236* (2013.01); *H01L 21/2855* (2013.01); *H01L 21/28568* (2013.01); *H01L 21/324* (2013.01); *H01L 27/1157* (2013.01); *H01L 27/11524* (2013.01); *H01L 27/11556* (2013.01); *H01L 27/11582* (2013.01); *H01L 29/04* (2013.01); *H01L 29/16* (2013.01)

(58) Field of Classification Search
None
See application file for complete search history.

(56) References Cited

U.S. PATENT DOCUMENTS

| | | |
|---|---|---|
| 5,627,085 A | 5/1997 | Gosain et al. |
| 5,686,335 A | 11/1997 | Wuu et al. |
| 8,940,592 B2 | 1/2015 | Qin et al. |
| 2007/0048453 A1 | 3/2007 | Qin et al. |
| 2010/0226195 A1 | 9/2010 | Lue |
| 2010/0259296 A1 | 10/2010 | Or-Bach |
| 2012/0292686 A1 | 11/2012 | Son et al. |
| 2013/0126865 A1 | 5/2013 | Chiang et al. |
| 2014/0197416 A1 | 7/2014 | Qin et al. |

*Primary Examiner* — Sonya D McCall Shepard
(74) *Attorney, Agent, or Firm* — Schwegman Lundberg & Woessner, P.A.

(57) ABSTRACT

Methods of forming thin-film transistors and memories are disclosed. In one such method, polycrystalline silicon is hydrogen plasma doped to form doped polycrystalline silicon. The doped polycrystalline silicon is then annealed. The hydrogen plasma doping and the annealing are decoupled.

20 Claims, 9 Drawing Sheets

| Grp | 55L H-PLAD | 55L Alloy | Wafers |
|-----|------------|-----------|--------|
| 1C | None | POR 407C 60min | 25 14 19 20 |
| 2E | HH7K5E17 | 400C 90min | 16 11 24 |
| 3E | HH7K75E17 | 400C 90min | 7 12 17 22 |
| 4E | HH7K1E18 | 400C 90min | 10 15 21 25 |
| 5E | HH7K5E17 | 400C 60min | 8 13 18 23 |
| 6E | HH7K5E17 | 400C 30min | 3 4 9 16 |

Fig. 5

MEMORIES AND METHODS OF FORMING THIN-FILM TRANSISTORS USING HYDROGEN PLASMA DOPING

PRIORITY APPLICATION

This application is a continuation of U.S. application Ser. No. 13/739,679, filed Jan. 11, 2013, which is incorporated herein by reference in its entirety.

BACKGROUND

There are many different types of memory used in electronics today, including random-access memory (RAM), read only memory (ROM), dynamic random access memory (DRAM), synchronous dynamic random access memory (SDRAM), and flash memory. Flash memory devices typically use transistor memory cells that allow for high memory densities, high reliability, and low power consumption and may be provided with different logic interfaces.

One of the more widely used flash memories is NAND flash memory. NAND flash memory has pushed density among the commercial memories through its excellent physical scalability and multi-level cell (MLC) approach. Demand has recently spiked for higher density, faster speed, and lower cost NAND flash memories in portable electronics. Reducing the size of the memory cell may be useful to meet this need.

Planar NAND cell scaling below 20 nm is extremely challenging due to interference between cells. However, the use of vertical 3D NAND strings allows further "bit-cost" scaling. Several 3D NAND schemes have been proposed, such as vertical gate (VG) NAND, pipe-shaped bit cost scalable (P-BiCS) NAND, and terabit cell array transistor (TCAT).

The above schemes use polycrystalline-silicon (poly-silicon) channel material. Depending on deposition conditions, e.g., temperature, pressure, and deposition method, thin-film transistor (TFT) performance may be significantly degraded when poly-silicon material is used (e.g., as compared to crystalline-Si material) due to defect traps and grain boundaries in poly-silicon film. To help solve this problem, hydrogenation may be used to address issues where insufficient hydrogen occurs in the polycrystalline grain boundaries.

Hydrogenation may be used to passivate the defect traps and improve the electrical characteristics of poly-silicon TFTs. Through hydrogenation, hydrogen atoms bond with silicon dangling bonds at the grain boundary and gate oxide/Si interface to passivate the defect traps. Several hydrogenation methods have been employed for poly-silicon TFTs. However, each has strengths and weaknesses. An annealing process is performed at 350-400° C. Annealing in a forming gas (H2+N2), however, suffers from very low hydrogen ion molecular diffusivity and hydrogen ion gradient.

Accordingly, new passivation and annealing techniques that can be used to address grain boundary defects that influence $V_t$, as well as the sub-threshold slope and intra-granular defects that influence mobility and leakage current, are desired.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates a PLAD hydrogenation process experiment matrix table according to an embodiment;

DETAILED DESCRIPTION

The systematic decrease of ion implantation (I/I) energy has been a successful approach to fabricating semiconductor layer junctions in the past. However, ion implantation does not appear to be sufficient for fabrication of nanometer devices on a smaller scale, due to ion beam transportation from the source to the target. However, plasma doping can help overcome such issues by placing the target close to the ion source to suppress ion beam transportation. For example, a plasma may be created in the volume adjacent to a material. The material is then pulsed with a negative potential. Ions are accelerated across the cathode sheath, and as a result are implanted within the material with energies that reflect the pulse voltage, the ion charge, and molecular makeup. The plasma is ignited by each pulse applied to the material, and extinguished when the pulse ends.

Figure 1:
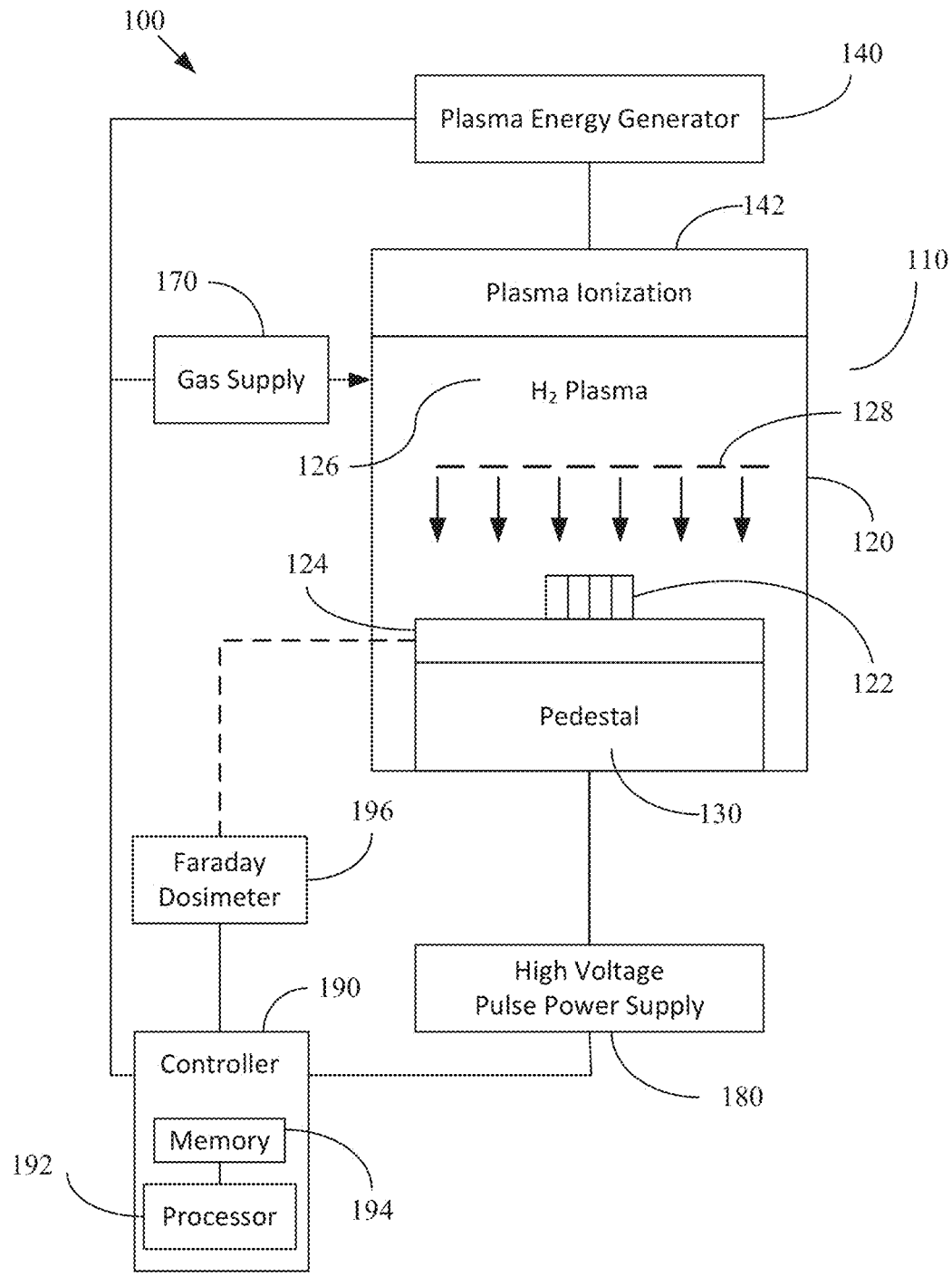
FIG. 1 illustrates the hydrogenation process and system of plasma doping according to an embodiment.

FIG. 1 illustrates the hydrogenation process and system of plasma doping 100 according to an embodiment. The illustrated plasma doping system 100 includes a reactor 110, a gas supply 170 for providing gases to the reactor 110, a power source 180 (shown schematically) for selectively applying a pulsed electrical potential to the workpiece 122, and a controller 190 (shown schematically) containing computer operable instructions for controlling the processing of the workpiece 122 in the reactor 110. The plasma doping system 100 can simultaneously form a plurality of doped regions across the workpiece 122, including shallow junctions, while minimizing deposition on the workpiece 122 as described below. The workpiece 122 includes poly-silicon material that is to be hydrogenated, wherein the poly-silicon material is vertically oriented.

The illustrated reactor 110 includes a chamber 120, an electrostatic chuck 124 for holding the workpiece 122 on a pedestal 130 in the chamber 120. The reactor 110 further includes a plasma energy generator 140 (shown schematically). Energy from the plasma energy generator 140 propagates into a plasma ionization area 142 wherein the gas, e.g. $H_2$, is induced into a plasma state to generate a plasma 126 in the chamber 120. The plasma energy generator 140 can include a power supply (e.g., DC, pulsed DC, or RF) to generate microwave, radio-frequency, or other suitable types of radiation at a frequency selected for producing the plasma 126. The plasma 126 can be a continuous plasma or a pulsed plasma. An electric field within a plasma sheath 128 accelerates ions toward the workpiece 122 to implant the ions into the surface of the workpiece 122. In other embodiments, however, the reactor 110 may not include the plasma energy generator 140. For example, in one embodiment, the power source 180 can include a pulsed DC power source that applies a pulsed electrical potential to the workpiece 122, which acts to solely generate the plasma 126 and provide the energy necessary to implant the ion species, e.g., $H_2$. In such an embodiment, the reactor 110 may not include the generator 140 because the potential applied to the workpiece 122 generates the plasma.

The controller 190 is operably coupled to the energy generator 140, the gas supply 170, and the power source 180 to control the processing parameters. Specifically, the controller 190 provides signals to the gas supply 170 for flowing gas into the chamber 120, and the energy generator 140 for generating a plasma from the gas in the plasma zone 126. The controller 190 also provides signals to the power source 180 for applying a pulsed negative electrical potential to the workpiece 122. The controller 190 includes memory 194 for storing data and a processor 192 coupled to the memory 194. The processor 192 of the controller 190 performs hydrogen plasma doping diffusion on the workpiece 122 to form a doped polycrystalline silicon layer in an area of the workpiece 122. The pulsed electrical potential draws ions from the plasma 126 toward the workpiece 122. Ions with sufficient momentum are implanted into the workpiece 122 and form doped regions. Post-implantation annealing is performed separately in an attempt to cover the whole channel through the lateral diffusion of the hydrogen ions in the workpiece 122. A Faraday dosimeter 196 may be used to measure conditions favorable for forming an electrical discharge. The Faraday dosimeter 196 is coupled to a sensor input of the controller 190. The Faraday dosimeter 196 measures the dose of the ions being implanted in the workpiece 122 and generates a signal related to the measured dose of ions to the controller 190.

Figure 2:
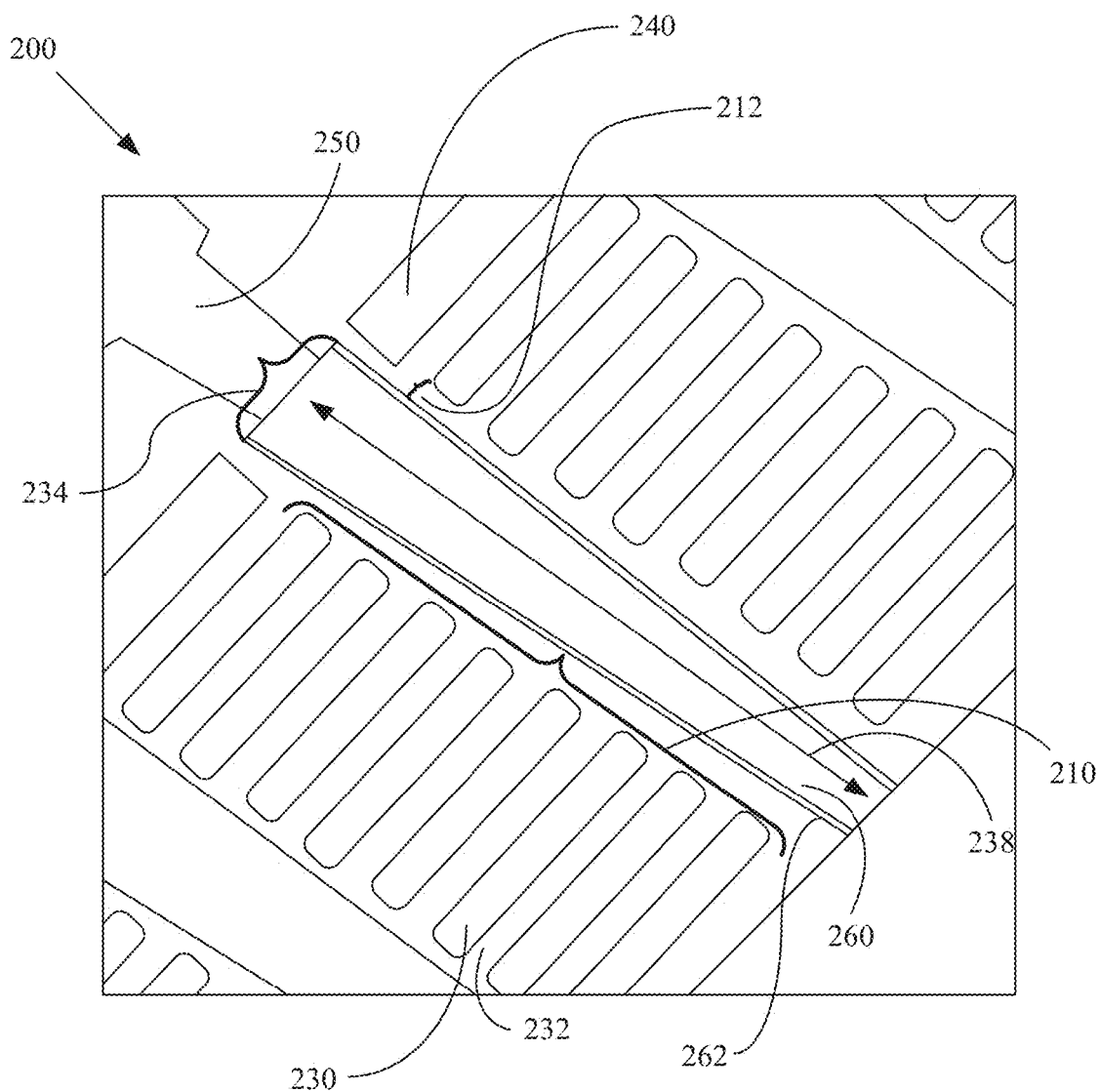
FIG. 2 illustrates an eight cell vertical NAND string according to an embodiment.

FIG. 2 illustrates an eight cell vertical NAND string 200 according to an embodiment. In FIG. 2, NAND cells 210 are stacked in each column. Thus, each stack of NAND cells form string 200. During fabrication of 3D NAND cells, a multitude of oxide/nitride or oxide/doped polycrystalline silicon stacked layers may be formed. For example, poly-silicon may be used as material of the 3D NAND device 200.

As shown in FIG. 2, the eight cell vertical NAND string 200 includes at least 8 memory cells 210. The string 200 is formed by depositing a stack of alternating layers 230, 232. The alternating layers 230, 232 include a first material 230 and a second material 232. The first material 230 may be a conductive or semiconductor control gate material, such as poly-silicon. The second material 232 may be a dielectric material. For example, an inter-poly dielectric (IPD) 232 may be formed between the layers of the first material 230. An opening 234 is formed in the stack. The first material 230 is recessed from the opening 234 and the second material 232 is also formed in the recesses 212 to act as a blocking dielectric. A tunnel dielectric layer 262 is formed proximate to the second material 232 formed in the recesses 212, e.g, on the walls of the opening 234. A semiconductor channel layer 260 is deposited and over the tunnel dielectric layer 262 and in the opening to form a pillar 238 of a channel for the NAND string 200. The material of the channel layer 260 may be polycrystalline silicon (poly-silicon or poly-Si).

At one end of the memory cells 210 is formed a self-aligned select gate 240, e.g., SGD. Although not shown in FIG. 2, a self-aligned select gate is also provided below the memory cells 210, e.g, SGS. The memory cells 210 are coupled between a bit line 250 or source line (not shown in FIG. 2) according to various embodiments. Poly-silicon material serves as the channel layer 260 for string 200. The tunnel dielectric 262 is formed around the poly-silicon material serving as the channel.

As can be seen in FIG. 2, the formation of the 3D NAND device 200 involves the establishment of poly-silicon layers, which may result in the creation of grain boundary and intra-granular defects that influence the characteristics of the 3D NAND device 200 in a negative manner, resulting in significant performance degradation. For example, unpaired bonds may exist at each grain boundary, or strained bonds may be formed within the poly-silicon grains. Thus, passivation by hydrogenation may be used during the fabrication process to reduce the density of these trap states and to improve device performance. For effective passivation by hydrogenation to remove the undesired strained bond states, a higher hydrogen concentration is often required than is the case for the hydrogen passivation of other states, e.g., at the grain boundaries caused by dangling bonds. This result occurs because the number of strained bonds is greater than the number of dangling bonds at a gain boundary.

Although several hydrogenation methods have been investigated to improve the quality of poly-silicon TFTs, such methods have typically resulted in much longer processing times (up to 16 hours) with only a limited improvement in TFT quality. The lack of improvement associated with these approaches appears to result from the limited diffusion of hydrogen through the surface of the poly-silicon material, the small sheath potential which results in a low hydrogen ion current, and the accumulation of surface charge on the insulating substrate which contributes to preventing hydrogen ions from penetrating into the poly-silicon material.

Following hydrogen ion implantation, post-implantation annealing is performed in an attempt to cover the whole channel through the lateral diffusion of the hydrogen ions. However, due to the vertical orientation of the ion beam used in implantation, the typical hydrogen ion dose in the small poly-silicon area near the gate may be not enough to passivate the entire channel.

Finally, pure diffusion processes have not been able to efficiently passivate the defects. Although a pure diffusion process will not damage the devices, as might the hydrogen implantation just discussed, a pure diffusion process cannot bring enough hydrogen ions to the device channel (except after very long periods of exposure). The long times required for pure diffusion to bring a sufficient number of hydrogen ions to the device channel make such a process unacceptable for most manufacturing purposes.

Figure 3:
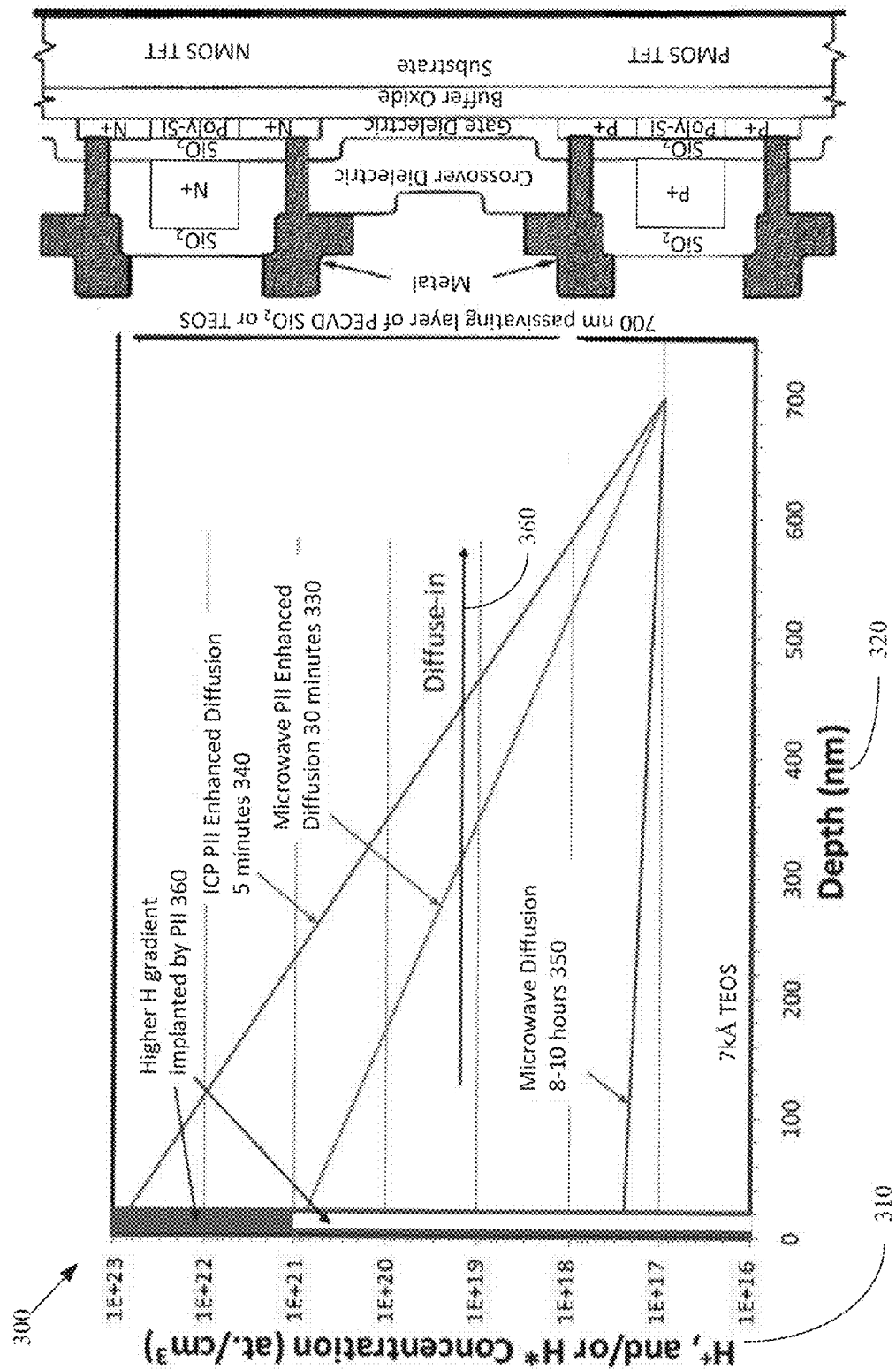
FIG. 3 illustrates diffusion of hydrogen based on a plurality of hydrogenation processes.

FIG. 3 illustrates diffusion of hydrogen based on a plurality of hydrogenation processes 300. In FIG. 3, the hydrogen ion/radical concentration 310 is plotted against the diffusion depth 320. Microwave hydrogen plasma ion implantation (PII) treatment 330 at about 350-400° C. takes about 30 minutes to improve device performance. As shown in FIG. 3, microwave hydrogen plasma ion implantation (PII) treatment 330 provides a concentration of approximately $1\times10^{21}$ atoms/$cm^3$ at the surface and linearly decreases to approximately $1\times10^{17}$ atoms/$cm^3$ at a depth of about 700 nanometers.

Inductively coupled plasma (ICP) hydrogen plasma ion implantation (PII) treatment 340 at about 350-400° C. takes about five minutes to improve device performance. The diffusion gradient of the inductively coupled plasma (ICP) hydrogen plasma ion implantation (PII) treatment 340 linearly decreases from a concentration of approximately $1\times10^{23}$ atoms/$cm^3$ at the surface to approximately $1\times10^{17}$ atoms/$cm^3$ at a depth of 700 nanometers.

Microwave hydrogen plasma treatment 350 at about 350-400° C. during the diffusion mode takes about 8-10 hours. For example, parallel plate (CCP mode) hydrogen RF plasma treatment 350 at about 350-400° C. takes about 8 hours to improve device performance. The diffusion gradient of the parallel plate (CCP mode) hydrogen RF plasma treatment varies linearly from a concentration of approximately $2.5 \times 10^{17}$ atoms/cm$^3$ at the surface and linearly decreases to approximately $1 \times 10^{17}$ atoms/cm$^3$ at a depth of 700 nanometers. As can be seen in FIG. 3, the arrows 360 demonstrate that the concentration at the surface provided by ICP PII hydrogen 340 is higher than that provided by the microwave PII enhanced diffusion 330

Nevertheless, all of the above plasma-based hydrogenation processes show device reliability issues which correlate to the plasma radiation (UV, high energy radiation, etc.), since plasma radiations is proportional to the plasma treatment time. The embodiments of the hydrogen PLAD methods described below provide much higher hydrogen concentrations on the poly-silicon material, e.g., orders of magnitude higher than those either without hydrogen PLAD hydrogenation or processed by prior methods.

Figure 4:
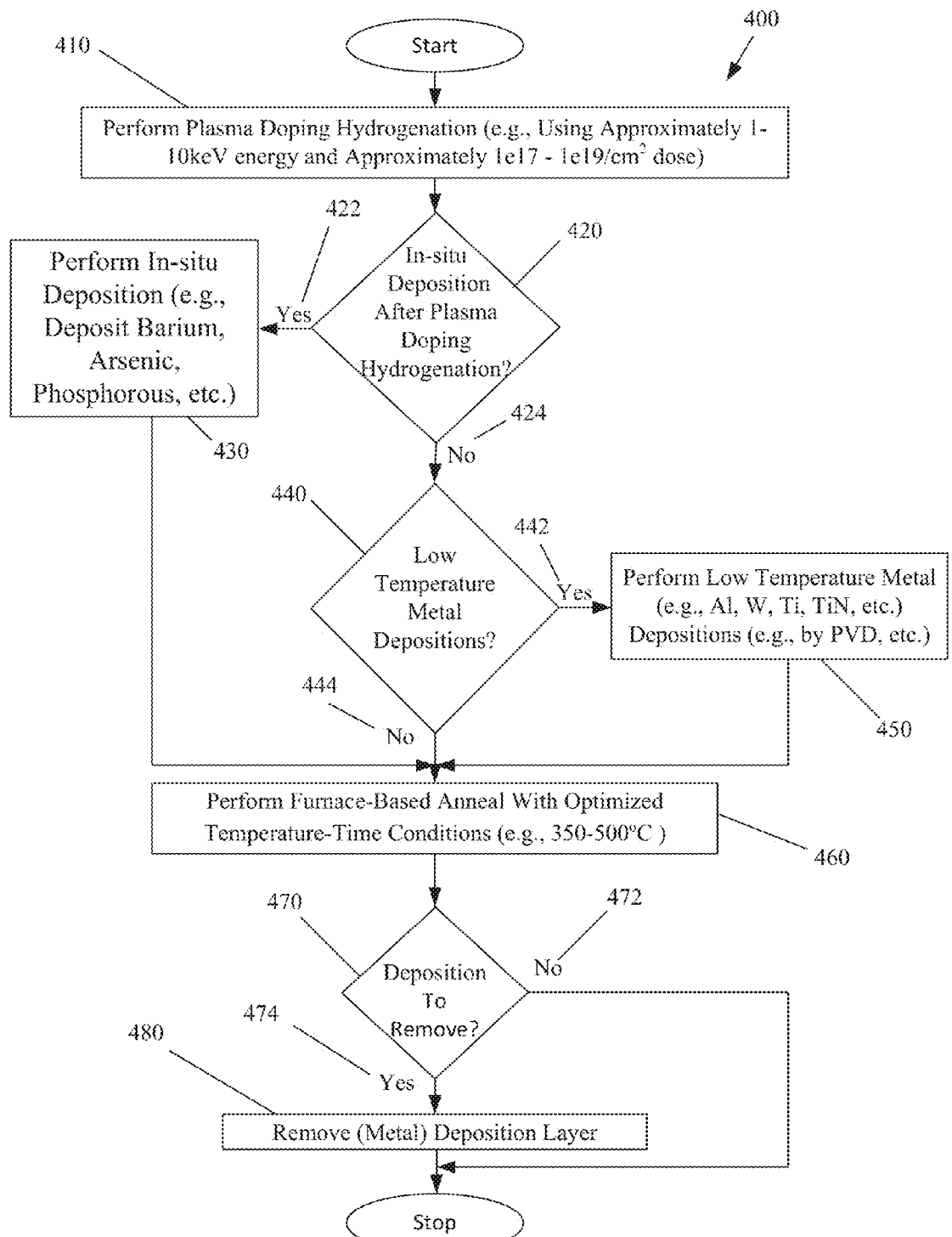
FIG. 4 is a flowchart showing embodiments of hydrogen plasma doping (PLAD) of poly-silicon 3D NAND thin film transistors (TFTS) according to an embodiment.

FIG. 4 is a flowchart 400 showing embodiments of hydrogen plasma doping (PLAD) of poly-silicon 3D NAND thin film transistors (TFTS) according to an embodiment. To resolve issues such as those described above, hydrogen plasma-doping the poly-silicon material and annealing of the doped material are decoupled. For example, the hydrogen PLAD may be optimized on a room-temperature substrate to minimize implant time, which minimizes device reliability issues and improves the throughput. The doped poly-silicon material may then be dechucked and annealed in a separate furnace, e.g., as part of batch processing, allowing for separate optimization of the anneal conditions.

In FIG. 4, hydrogen plasma doping (PLAD) is performed at block 410. The PLAD process may be performed using an energy of approximately 1-10 keV and a hydrogen dose of approximately 1e17-1e19/cm$^2$.

A decision is made whether in-situ deposition is to be performed at block 420. An in-situ deposition material may serve as a diffusion stop layer to prevent diffusion of hydrogen during the furnace-based anneal process. If so, branch 422 is taken, and in-situ deposition is performed at block 430, e.g., using boron (B), Argon (Ar), Phosphorus (P), etc. If in situ deposition is not performed, branch 424 is taken, and a decision is then made to determine whether low temperature metal deposition is performed at block 440, e.g., metal deposition may be performed at temperatures below 400° C. and as low as ambient room temperature (approximately 20° C.). In this third embodiment, the deposited metal may serve as a diffusion stop layer to prevent diffusion of hydrogen during the furnace-based anneal process. If so, branch 442 is taken, and low temperature metal deposition is performed at block 450, e.g., metals such as aluminum (Al), tungsten (W), titanium (Ti), TiN, etc., may be deposited. If low temperature metal deposition is not performed, branch 444 is taken, and after in-situ deposition at block 430, or after low temperature metal deposition is completed at block 450, the doped polycrystalline silicon (with or without the further deposition material) is annealed, e.g., in a separate furnace, at block 460, e.g., using particular temperature and time conditions optimized for the diffusion. For example, the annealing may be performed at about 350-400° C. for a particular time depending on the material, ion concentration, etc.

At this point, a decision is made as to whether deposition material should be removed at block 470. Depending on the type of deposition performed, in-situ deposition material or metal material may be removed. If not, branch 472 is taken, and the process is complete. If deposition material should be removed, branch 474 is taken, and the deposition material is removed at block 480.

Accordingly, a first embodiment may include two or more activities:
1. Performing hydrogen PLAD with approximately 1-10 keV energy and approximately $1 \times 10^{17}$-$1 \times 10^{19}$/cm$^2$ dose at block 410 to form doped polycrystalline silicon.
2. performing a furnace-based anneal of the doped polycrystalline silicon at about 350-400° C. with optimized temperature-time conditions at block 460.

A hydrogen dose as high as $1 \times 10^{19}$/cm$^2$ may be useful to compensate for hydrogen loss that occurs from hydrogen diffusing out during the annealing process.

Thus, a second embodiment may include three or more activities:
1. Performing hydrogen PLAD with approximately 1-10 keV energy and approximately $5 \times 10^{18}$/cm$^2$ dose with in-situ deposition (B, As, or P) after H PLAD at block 410 and 430 to form doped polycrystalline silicon.
2. Performing a furnace-based anneal of the doped polycrystalline silicon at about 350-400° C. with optimized temperature-time conditions at block 460.
3. Removing the deposition material at block 480.

An in-situ deposition material may serve as a diffusion stop layer to prevent diffusion of hydrogen during the furnace-based anneal process.

Therefore, a third embodiment may include four or more activities:
1. Performing hydrogen PLAD with approximately 1-10 keV energy and approximately $5 \times 10^{18}$/cm$^2$ dose at block 410.
2. Performing low temperature metal depositions (e.g., Al, W, Ti, TiN) by physical vapor deposition (PVD), chemical vapor deposition (CVD), plasma-enhanced chemical vapor deposition (PECVD), etc. at block 450
3. Perform a furnace-based anneal of the doped polycrystalline silicon and metal deposition at about 350-400° C. with optimized temperature & time conditions at block 460.
4. Remove deposited metal at block 480.

In this third embodiment, the deposited metal may serve as a diffusion stop layer to prevent diffusion of hydrogen during the furnace-based anneal process.

High hydrogen ion doses may be delivered at room temperature without overheating the polycrystalline silicon by using a Johnsen-Rahbek (J-R) type electrostatic chuck (ESC), e.g., $1 \times 10^{19}$/cm$^2$H$^+$ dose in 1 minute at room temperature. A furnace-based (batch process) anneal at block 480 may be optimized to achieve better substrate temperature control and improve the throughput even further. A substrate having electronics formed thereon, e.g., memory, may be processed according to the method described above with regard to flowchart shown in FIG. 4. The processes described herein may help mitigate one or more of the issues normally presented when PLAD and annealing are coupled, including substrate de-chucking, poor substrate temperature control, higher cost of heated J-R type electrostatic chuck used to hold substrates, etc. Accordingly, the processes may provide a lower cost and higher throughput.

Moreover, the operation of NAND 3D poly-silicon array devices processed using PLAD hydrogenation and decoupled annealing, when the processing is performed according to the embodiments described herein, may significantly improve by increasing current carrier (electron or hole) mobility and by providing a decrease in the off-state leakage current (Ioff).

Defects from a SiO2/Si interface and poly grain boundaries may also be more effectively passivated.

FIG. 5 illustrates a PLAD hydrogenation process experiment matrix table 500 according to an embodiment. In FIG. 5, the groups 510-560 are processed by performing hydrogen PLAD to form a doped polycrystalline silicon layer and separately performing a furnace-based anneal of the doped polycrystalline silicon layer with optimized temperature-time conditions. The wafers 512, 522, 532, 542, 552, 562 are shown for each group 510, 520, 530, 540, 550, 560, respectively.

Figure 6:
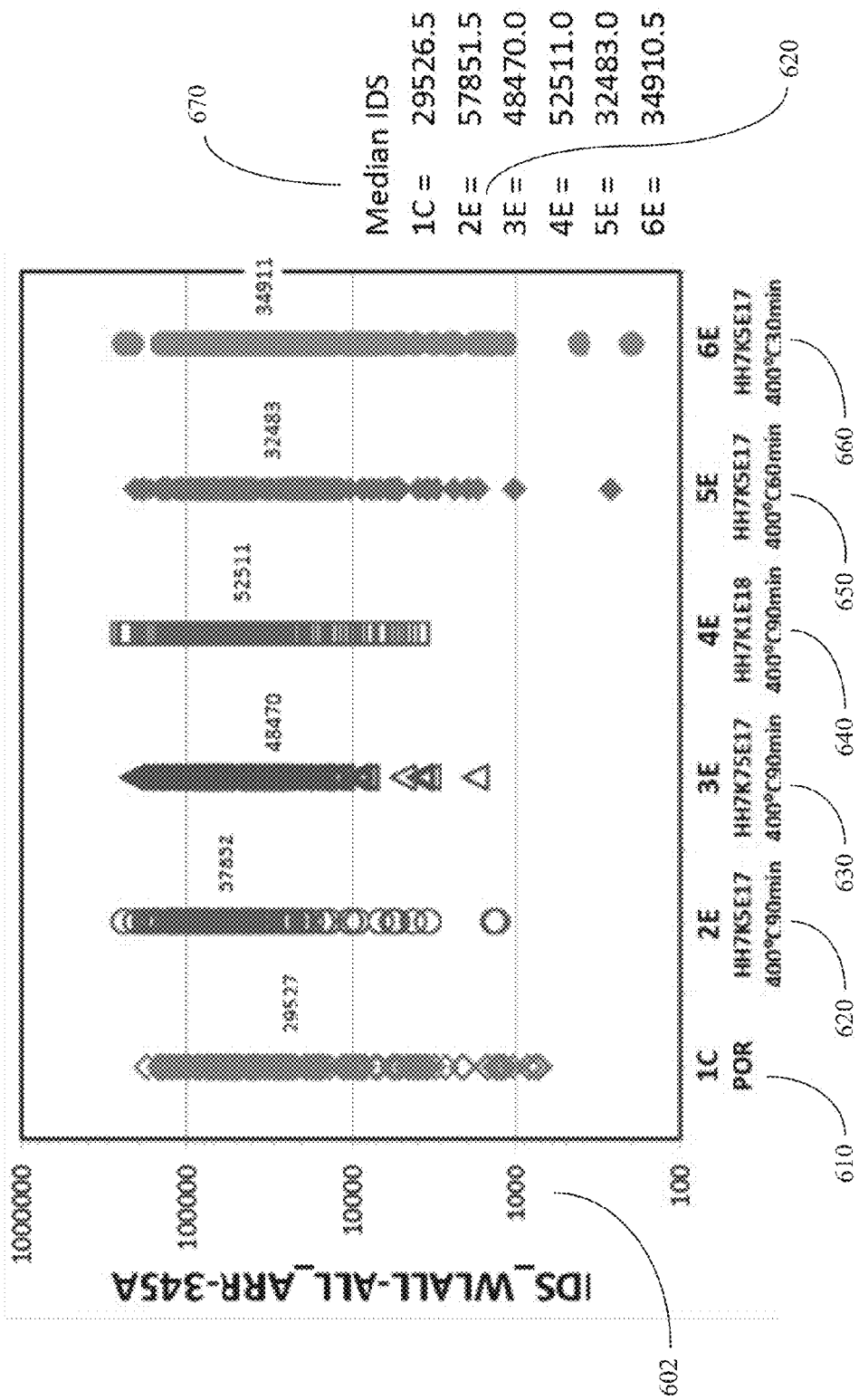
FIG. 6 illustrates ON current for the six groupings of wafers according to an embodiment.

FIG. 6 illustrates ON current for the six groupings of wafers 600 according to an embodiment. In FIG. 6, Ion indicates the ON current IDS. The ON current is plotted on a logarithmic scale 602 as shown on the left. At the bottom of FIG. 6, each of the groupings of wafers 610, 620, 630, 640, 650, 660 and their parameters are identified. On the right, the median IDS 670 is shown for the six groupings of wafers 610, 620, 630, 640, 650, 660. As can be seen, the 2E grouping 620 has the highest median IDS representing an increase of two fold.

Figure 7:
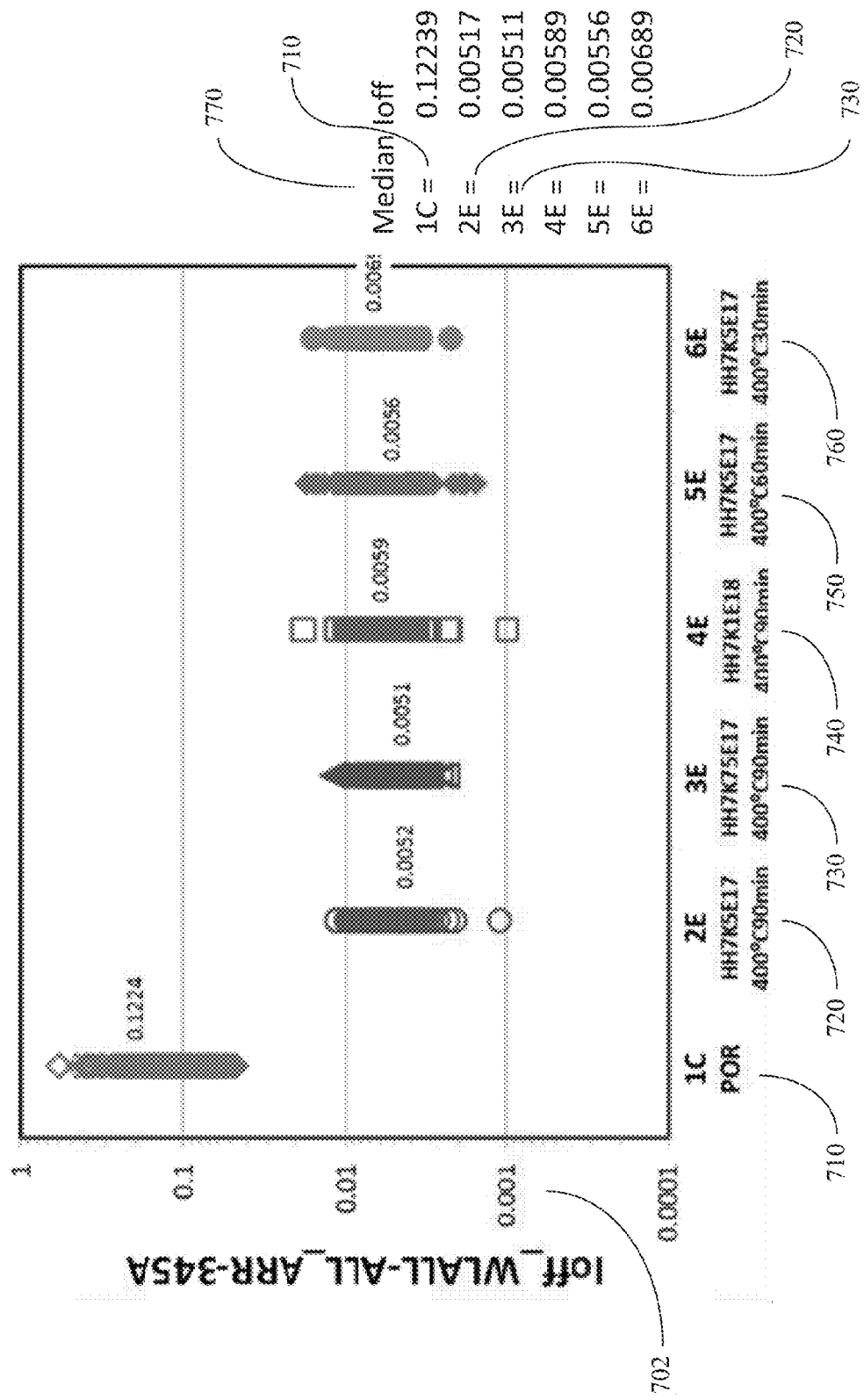
FIG. 7 illustrates the OFF current plotted on a logarithmic scale for the six groupings of wafers according to an embodiment.

FIG. 7 illustrates the OFF current plotted on a logarithmic scale for the six groupings of wafers 700 according to an embodiment. In FIG. 7, Ioff indicates the OFF current. The OFF current is plotted on a logarithmic scale 702 as shown on the left. At the bottom of FIG. 7, each of the groupings of wafers 710, 720, 730, 740, 750, 760 and their parameters are identified. On the right, the median OFF current 770 is shown for the six groupings of wafers 710, 720, 730, 740, 750, 760. As can be seen, the 2E 720 and 3E 730 groupings have the lowest median Ioff representing a decrease of 24 times decrease of the grouping treated by the process of record (POR) 710.

Figure 8:
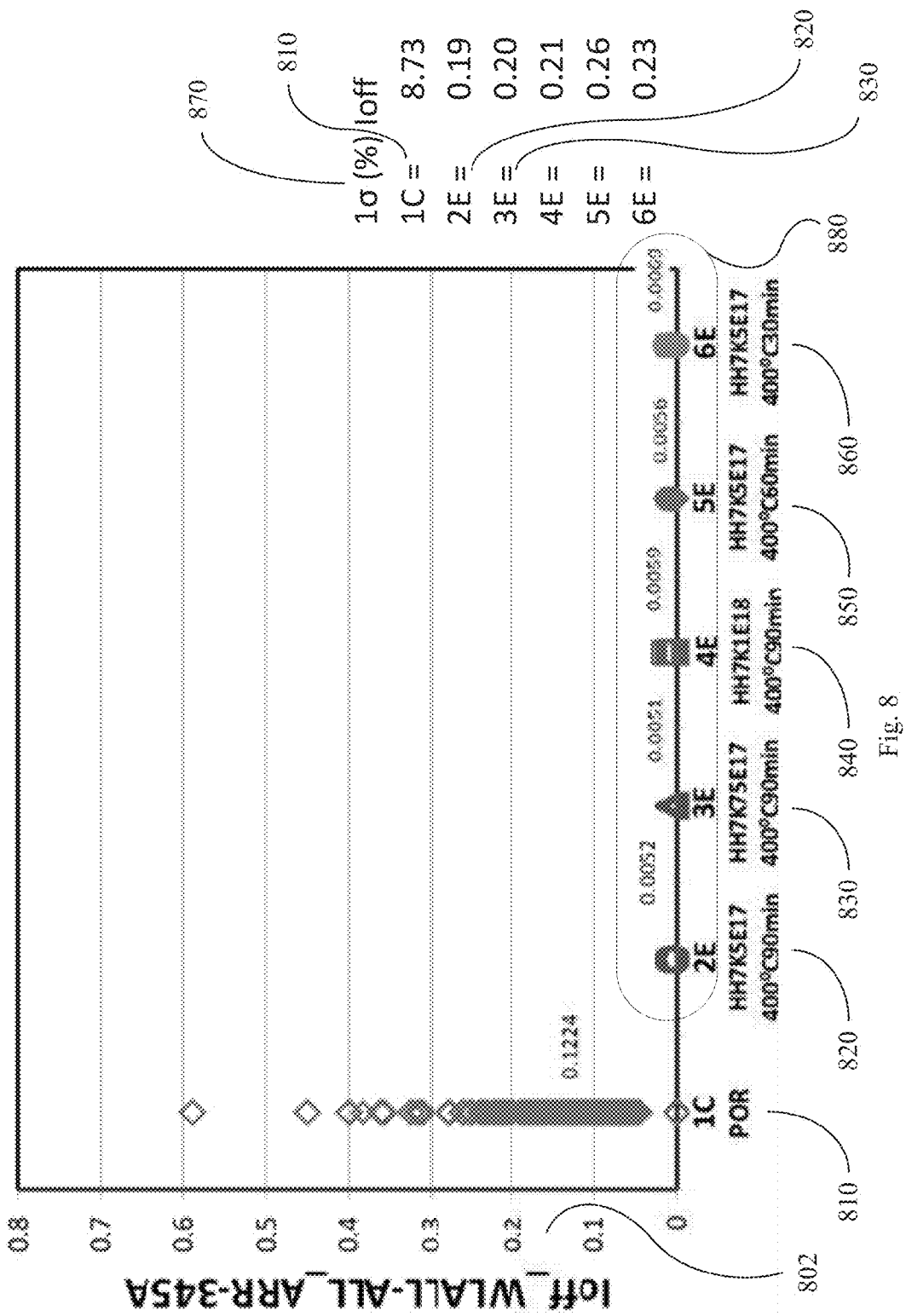
FIG. 8 illustrates the OFF current plotted on a linear scale for the six groupings of wafers according to an embodiment.

FIG. 8 illustrates the OFF current plotted on a linear scale for the six groupings of wafers 800 according to an embodiment. In FIG. 8, Ioff, again, indicates the OFF current. The OFF current is plotted on a linear scale 802 as shown on the left. At the bottom of FIG. 8, each of the groupings of wafers 810, 820, 830, 840, 850, 860 and their parameters are identified. On the right, the standard deviation (%) of the OFF current 870 is shown for the six groupings of wafers 810, 820, 830, 840, 850, 860. As can be seen, the 2E 820 and 3E 830 groupings have the lowest Ioff representing a decrease of 24 times the decrease of the grouping treated by the process of record (POR) 810. Further, the linear scale representation of Ioff 800 shows a much tighter distribution 880.

Figure 9:
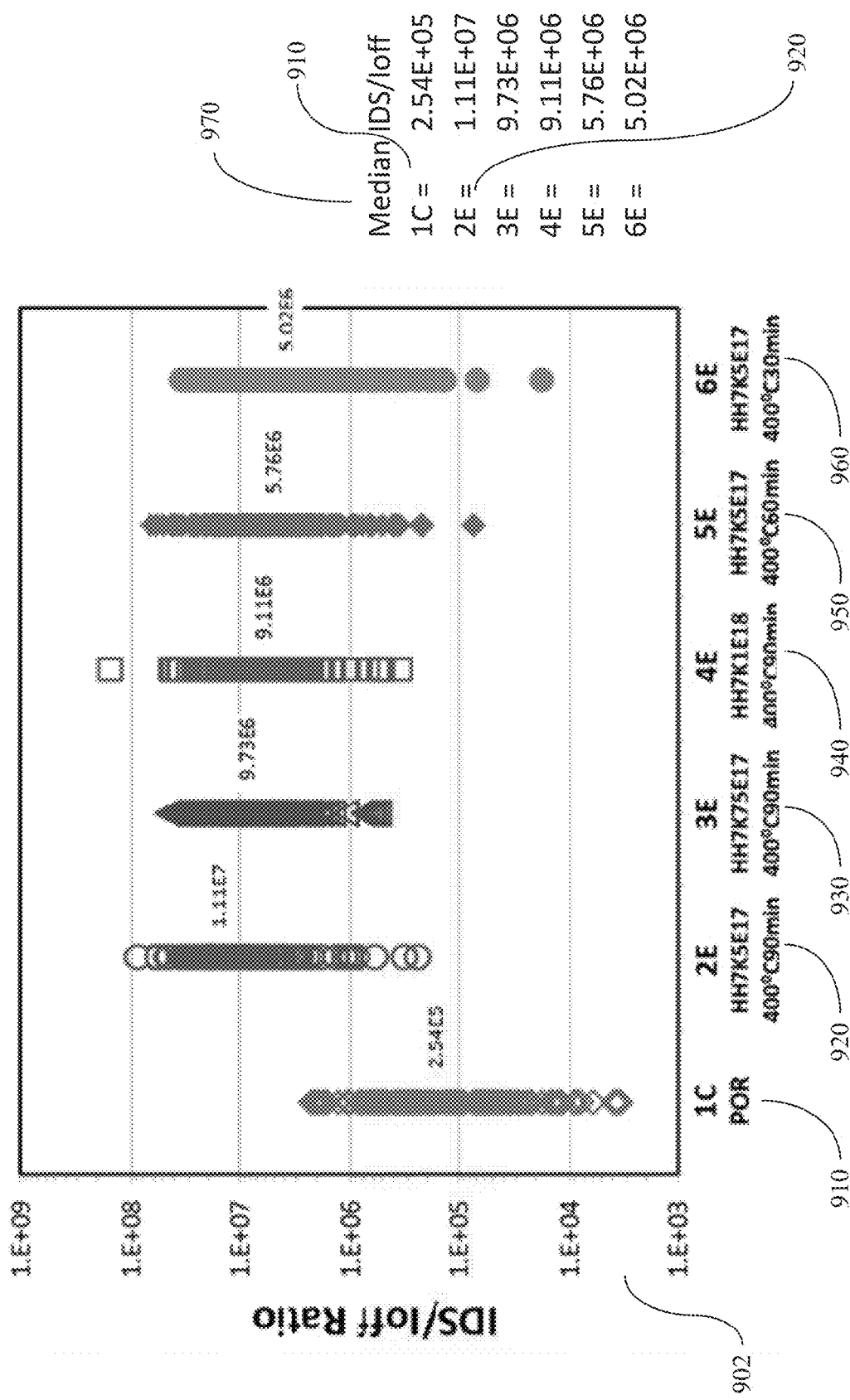
FIG. 9 illustrates the ON current/OFF current (Ion/Ioff) ratio for the six groupings of wafers according to an embodiment.

FIG. 9 illustrates the ON current/OFF current (Ion/Ioff) ratio for the six groupings of wafers 900 according to an embodiment. The ON current/OFF current ratio is plotted on a logarithmic scale 902 as shown on the left. At the bottom of FIG. 9, each of the groupings of wafers 910, 920, 930, 940, 950, 960 and their parameters are identified. On the right, the median ON current/OFF current ratio 970 is shown for the six groupings of wafers 910, 920, 930, 940, 950, 960. As can be seen, the 2E grouping 920 has the highest Ion/Ioff ratio of $1.11 \times 10^7$. Further, the 2E grouping 920 has the best increase, which is an increase of 44 times over the median Ion/Ioff ratio for the grouping treated by the process of record (POR) 910.

Thus, the hydrogen plasma doping (PLAD) hydrogenation process according to the embodiment described above significantly improves 100S NAND 3D poly-silicon array devices including Ion increase (mobility enhancement) and Ioff decrease. The defects from $SiO_2$/Si interface and poly grain boundaries are effectively passivated. As shown in FIGS. 5-9, the grouping of 2E i.e., HH7K5E17/400° C. 90 min process, shows the overall best results including 2× Ion increase (mobility increase), 24× Ioff decrease with 46× better 1σ distribution, and 44× Ion/Ioff ratio increase than the process of record (POR). Further, the Ion/Ioff ratio of $1.11 \times 10^7$ meets a goal of having an Ion/Ioff ratio of $1 \times 10^7$.

In addition, the embodiments described above are easily recognized and detectable because: the hydrogen concentrations on the wafer surface will be at least 2-3 orders of magnitudes higher than those either without hydrogen PLAD processing or processed by the previous methods. Hydrogen concentrations can be measured by several well-established techniques, such as whole wafer secondary ion mass spectrometry (SIMS) and nuclear reaction analysis (NRA). Further, hydrogen concentration measurements can be directly conducted on the wafer level of the final products, e.g., the final passivation layer surfaces such as TEOS or $Si_3N_4$ films, and are totally non-destructive requiring no cross-sectional, no assembly, and no sample preparation.

The above detailed description includes references to the accompanying drawings, which form a part of the detailed description. The drawings show, by way of illustration, specific embodiments that may be practiced. These embodiments are also referred to herein as "examples." Such examples can include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is to allow the reader to quickly ascertain the nature of the technical disclosure, for example, to comply with 37 C.F.R. §1.72(b) in the United States of America. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is part of any claim. Rather, embodiments may include less than all features of those disclosed in a particular example. Thus, the following claims are hereby incorporated into the Detailed Description, with each claim standing on its own as a separate embodiment. The scope of the embodiments disclosed herein should be determined with reference to the appended claims, along with the full scope of equivalents to which such claims are entitled.

What is claimed is:

1. A method of forming a memory cell string, comprising:
    forming polycrystalline silicon in an opening in a stack of alternating layers of poly-silicon material and dielectric material to form a pillar of a channel for a NAND string;
    hydrogen plasma doping the polycrystalline silicon to form doped polycrystalline silicon;
    in-situ depositing of a deposition material;
    separately annealing the doped polycrystalline silicon, wherein the hydrogen plasma doping and the annealing are decoupled; and
    removing the deposition material after annealing the doped polycrystalline silicon.

2. The method of claim 1, wherein in-situ depositing of the deposition material comprises the in-situ depositing of an element selected from a group consisting of boron (B), Argon (Ar) and Phosphorus (P).

3. The method of claim 1, further comprising:
    forming the stack of alternating layers.

4. The method of claim 1, further comprising:
    forming the opening in the stack of alternating layers.

5. The method of claim 1, further comprising:
    forming a tunnel dielectric along the opening.

6. The method of claim 1, further comprising:
    recessing the polycrystalline silicon from the opening to form recesses along the opening.

7. The method of claim 1, wherein hydrogen plasma doping the polycrystalline silicon comprises hydrogen plasma doping the polycrystalline silicon using an energy of about 1-10 keV and a hydrogen dose of about $1 \times 10^{17}$ to about $1 \times 10^{19}/cm^2$.

8. The method of claim 1, wherein hydrogen plasma doping the polycrystalline silicon comprises hydrogen plasma doping the polycrystalline silicon using an energy of about 1-10 keV and a hydrogen dose of about $5 \times 10^{18}/cm^2$.

9. The method of claim 1, wherein hydrogen plasma doping the polycrystalline silicon comprises hydrogen plasma doping the polycrystalline silicon at approximately room temperature.

10. The method of claim 1, wherein hydrogen plasma doping the polycrystalline silicon comprises hydrogen plasma doping the polycrystalline silicon in a chamber.

11. The method of claim 10, wherein separately annealing the doped polycrystalline silicon comprises annealing the doped polycrystalline silicon in a furnace that is separate from the chamber.

12. The method of claim 1, wherein the annealing comprises furnace annealing.

13. The method of claim 1, wherein annealing the doped polycrystalline silicon comprises annealing using a temperature of approximately 350-400° C.

14. A method of forming a memory cell string, comprising:
    forming polycrystalline silicon in an opening in a stack of alternating layers of poly-silicon material and dielectric material to form a pillar of a channel for a NAND string;
    hydrogen plasma doping the polycrystalline silicon to form doped polycrystalline silicon;
    depositing a metal;
    separately annealing the doped polycrystalline silicon, wherein the hydrogen plasma doping and the annealing are decoupled; and
    removing the metal after annealing the doped polycrystalline silicon.

15. The method of claim 14, wherein depositing the metal comprises depositing the metal selected from the group consisting of aluminum (Al), tungsten (W), titanium (Ti) and titanium nitride (TiN).

16. The method of claim 14, wherein depositing the metal comprises physical vapor depositing the metal.

17. A memory formed according to a method, the method comprising:
    forming polycrystalline silicon in an opening in a stack of alternating layers of poly-silicon material and dielectric material to form a pillar of a channel for a NAND string in a three-dimensional NAND array;
    hydrogen plasma doping the polycrystalline silicon to form doped polycrystalline silicon;
    in-situ depositing of a deposition material;
    annealing the three-dimensional NAND array, wherein the hydrogen plasma doping and the annealing are decoupled; and
    removing the deposition material after annealing the three-dimensional NAND array.

18. The memory of claim 17, wherein the method further comprises:
    forming charge storage structures in recesses in the opening in the stack, the recesses formed by recessing the poly-silicon material from the opening.

19. The memory of claim 17, wherein in-situ depositing of the deposition material comprises depositing the deposition material comprising a metal.

20. The memory of claim 17, wherein removing the deposition material comprises removing a metal layer.

* * * * *